United States Patent
Behnke

(10) Patent No.: US 8,945,978 B2
(45) Date of Patent: Feb. 3, 2015

(54) FORMATION OF METAL STRUCTURES IN SOLAR CELLS

(71) Applicant: SunPower Corporation, San Jose, CA (US)

(72) Inventor: Joseph Frederick Behnke, San Jose, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 13/931,520

(22) Filed: Jun. 28, 2013

(65) Prior Publication Data

US 2015/0004744 A1  Jan. 1, 2015

(51) Int. Cl.
| | |
|---|---|
| H01L 21/00 | (2006.01) |
| H01L 21/302 | (2006.01) |
| H01L 21/461 | (2006.01) |
| H01L 21/31 | (2006.01) |
| H01L 21/469 | (2006.01) |
| H01L 31/18 | (2006.01) |

(52) U.S. Cl.
CPC ..................................... *H01L 31/18* (2013.01)
USPC ............ 438/98; 438/708; 438/709; 438/788; 438/792; 257/E27.124; 257/E27.125; 257/E27.126; 257/E25.007; 257/E25.008; 257/E25.009

(58) Field of Classification Search
USPC ............................. 438/98, 708, 709, 788, 792; 257/E27.124, E27.125, E27.126, 257/E25.007, E25.008, E25.009
See application file for complete search history.

(56) References Cited

U.S. PATENT DOCUMENTS

| | | | |
|---|---|---|---|
| 8,241,763 B2* | 8/2012 | Buesing et al. .............. 428/690 |
| 8,367,555 B2* | 2/2013 | Afzali-Ardakani et al. .. 438/745 |
| 8,426,241 B2* | 4/2013 | Ahmed et al. .................. 438/98 |
| 8,545,998 B2* | 10/2013 | Kong et al. .................... 428/699 |
| 8,629,431 B2* | 1/2014 | Etori et al. ....................... 257/40 |
| 8,685,858 B2* | 4/2014 | Hong et al. .................... 438/694 |
| 8,748,877 B2* | 6/2014 | Orita et al. ....................... 257/40 |
| 2004/0200520 A1 | 10/2004 | Mulligan et al. |
| 2008/0035489 A1 | 2/2008 | Allardyce et al. |
| 2009/0017617 A1 | 1/2009 | Rohatgi et al. |
| 2010/0055422 A1* | 3/2010 | Kong et al. .................... 428/209 |
| 2010/0213455 A1* | 8/2010 | James et al. ..................... 257/40 |
| 2011/0017291 A1* | 1/2011 | Morita et al. ................. 136/256 |
| 2011/0041911 A1 | 2/2011 | Lee et al. |
| 2011/0108115 A1* | 5/2011 | Deligianni et al. ........... 136/262 |
| 2012/0061790 A1 | 3/2012 | Ahmed et al. |
| 2012/0164827 A1 | 6/2012 | Rajagopalan et al. |
| 2012/0181529 A1* | 7/2012 | Tanaka et al. .................... 257/40 |
| 2012/0231575 A1* | 9/2012 | Okaniwa ......................... 438/97 |
| 2012/0305066 A1* | 12/2012 | Fisher et al. .................. 136/256 |
| 2013/0065351 A1* | 3/2013 | Baker-O'Neal et al. ......... 438/72 |

OTHER PUBLICATIONS

PCT International Search Report and Written Opinion of the International Searching Authority for Application No. PCT/US2014/041973, Oct. 7, 2014, 7 sheets.

* cited by examiner

*Primary Examiner* — Evan Pert
*Assistant Examiner* — Gustavo Ramallo
(74) *Attorney, Agent, or Firm* — Okamoto & Benedicto LLP

(57) ABSTRACT

A metal contact of a solar cell is formed by electroplating copper using an electroplating seed that is formed on a dielectric layer. The electroplating seed includes an aluminum layer that connects to a diffusion region of the solar cell through a contact hole in the dielectric layer. A nickel layer is formed on the aluminum layer, with the nickel layer-aluminum layer stack forming the electroplating seed. The copper is electroplated in a copper plating bath that has methanesulfonic acid instead of sulfuric acid as the supporting electrolyte.

20 Claims, 6 Drawing Sheets

101, 102    103

111, 113

FORMATION OF METAL STRUCTURES IN SOLAR CELLS

TECHNICAL FIELD

Embodiments of the subject matter described herein relate generally to solar cells. More particularly, embodiments of the subject matter relate to solar cell fabrication processes and structures.

BACKGROUND

Solar cells are well known devices for converting solar radiation to electrical energy. A solar cell has a front side that faces the sun during normal operation to collect solar radiation and a backside opposite the front side. Solar radiation impinging on the solar cell creates electrical charges that may be harnessed to power an external electrical circuit, such as a load. The external electrical circuit may be electrically connected to diffusion regions of the solar cell by way of metal contacts.

BRIEF SUMMARY

In one embodiment, a metal contact of a solar cell is formed by electroplating copper using an electroplating seed that is formed on a dielectric layer. The electroplating seed includes an aluminum layer that connects to a diffusion region of the solar cell through a contact hole in the dielectric layer. A nickel layer is formed on the aluminum layer, with the nickel layer-aluminum layer stack forming the electroplating seed. The copper is electroplated in a copper plating bath that has methanesulfonic acid instead of sulfuric acid as the supporting electrolyte.

These and other features of the present disclosure will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

In the present disclosure, numerous specific details are provided, such as examples of materials, process steps, and structures, to provide a thorough understanding of embodiments. Persons of ordinary skill in the art will recognize, however, that the disclosure can be practiced without one or more of the specific details. In other instances, well-known details are not shown or described to avoid obscuring aspects of the disclosure.

To be commercially viable against other sources of energy, solar cells need to be manufactured at relatively low cost and with high yield. One way of lowering the cost of manufacturing solar cells is to use printed aluminum as an electroplating seed for copper metal contacts. However, aluminum can have an adhesion problem when exposed to high acid copper plating baths typically employed in copper electroplating processes.

Figure 1:
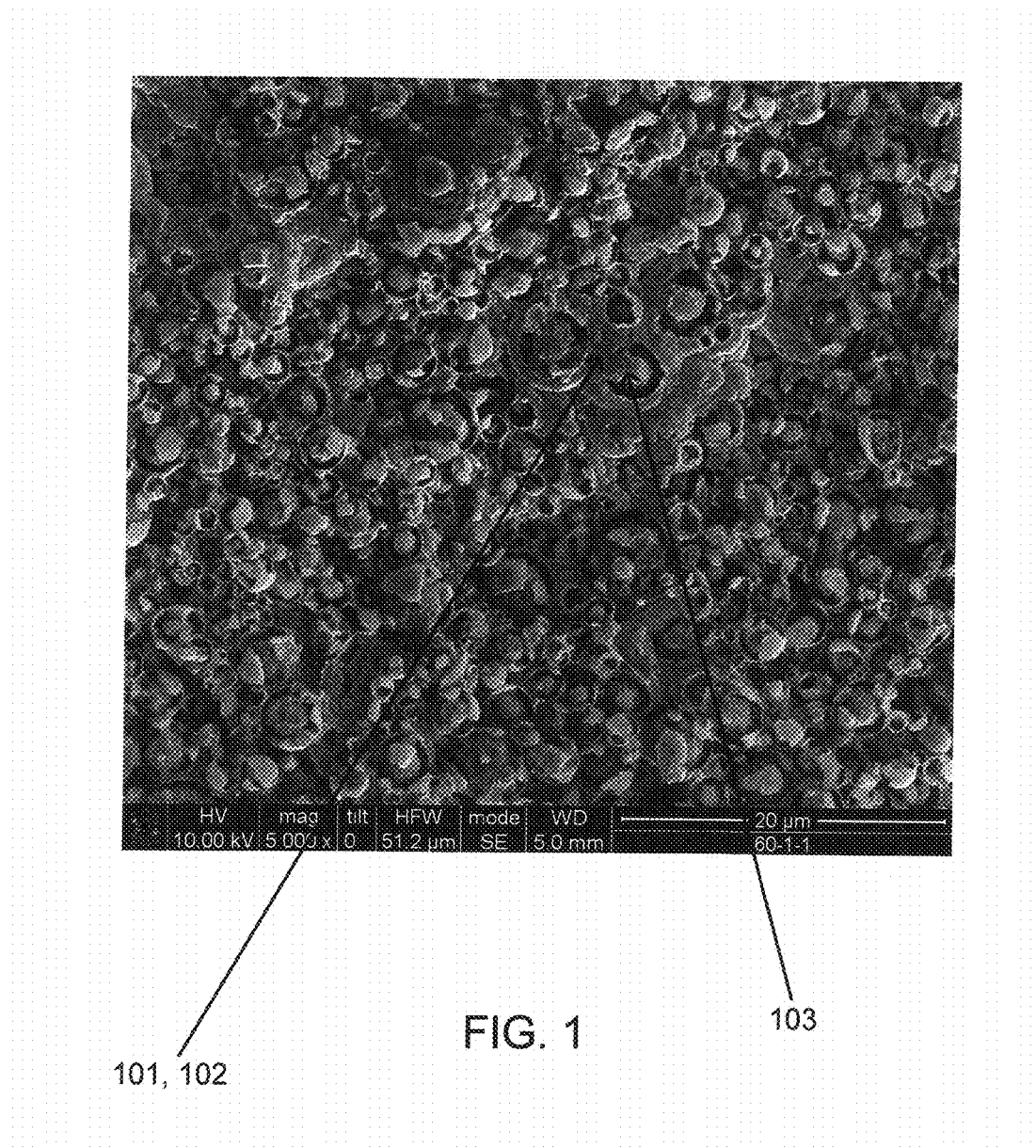
FIGS. 1-3 show micrographs of an aluminum electroplating seed where the aluminum electroplating seed is exposed to sulfuric acid.
Figure 2:
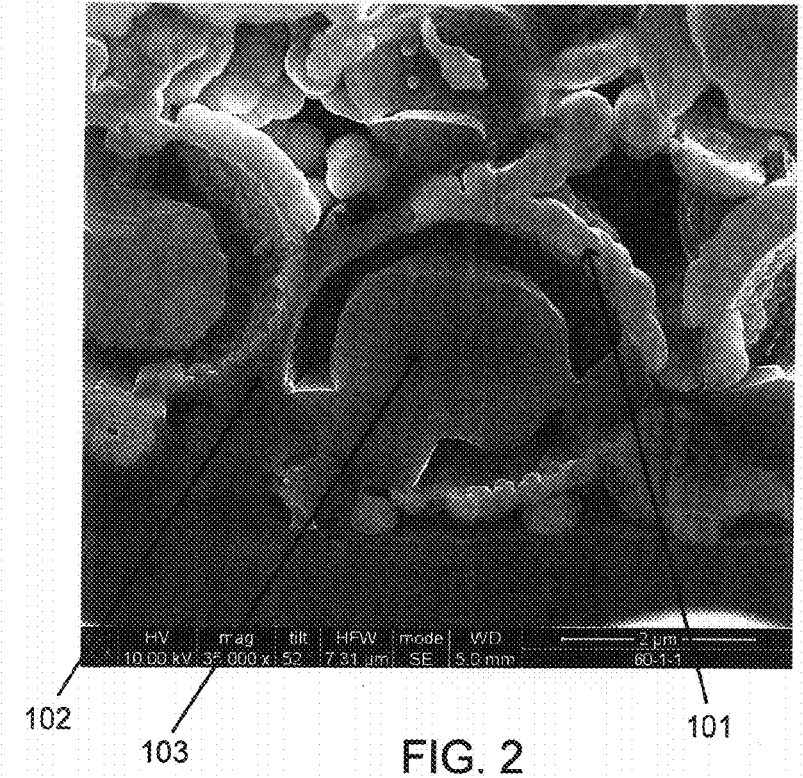
Figure 3:
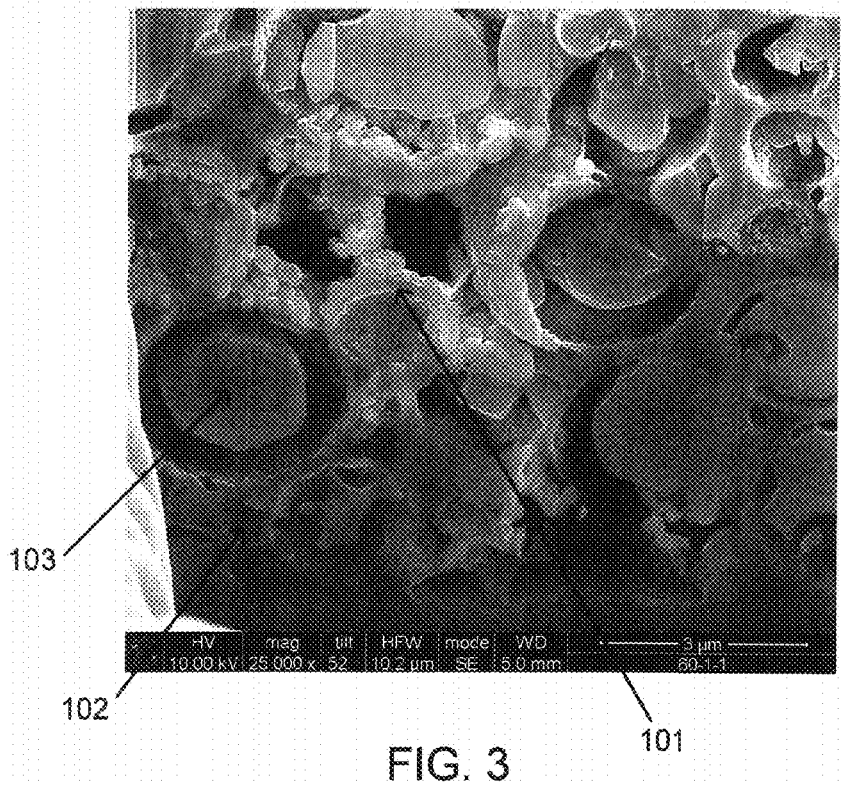

The adhesion problem is illustrated in FIGS. 1-3 in the form of micrographs of the aluminum. Printed aluminum was exposed to 200 g/l sulfuric acid, which is the sulfuric acid content of some industrial copper plating baths. FIG. 1 is a plan view of the aluminum and FIGS. 2 and 3 are cross-sections of the aluminum. As can be seen from FIGS. 1-3, the aluminum (see arrow 103) was significantly attacked, while the nickel (see arrow 101) and paste binder (see arrow 102) that form an electroplating seed with the aluminum were unaffected. The results may be explained by the reaction of aluminum with sulfuric acid as follows:

with a $\Delta G(rxn)=-971.0$ kJ/mol

The aluminum in the electroplating seed has a thin, dense layer of aluminum oxide that may need to be penetrated before the above-noted chemical reaction can occur. The reaction of aluminum oxide with sulfuric acid is given by:

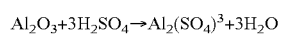

with a $\Delta G(rxn)=-100.5$ kJ/mol.

The negative $\Delta G(rxn)$, i.e., negative Gibbs free energy, of the aluminum and aluminum oxide reactions indicates that corrosion will occur when aluminum and aluminum oxide are exposed to sulfuric acid.

FIGS. 4-7 show cross-sections schematically illustrating fabrication of a solar cell 200 in accordance with one embodiment. FIGS. 4-7 are not drawn to scale to more clearly illustrate features of the embodiment.

Figure 4:
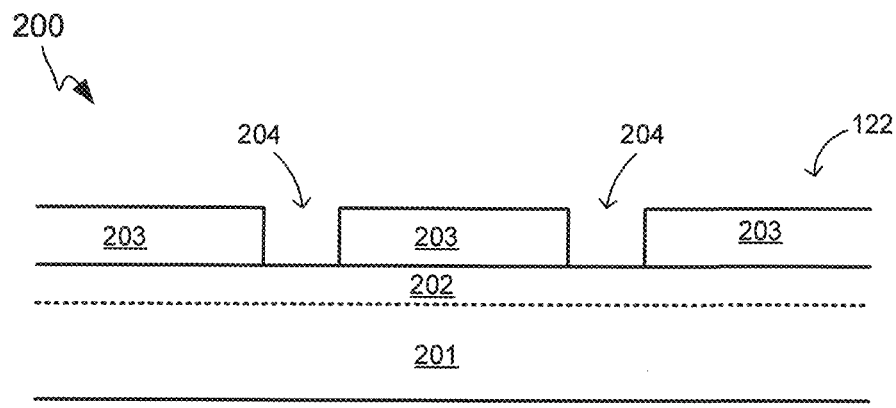
FIGS. 4-7 show cross-sections schematically illustrating fabrication of a solar cell in accordance with an embodiment of the present disclosure.

Referring to FIG. 4, the solar cell 200 includes a solar cell substrate 201 and a diffusion region 202. The substrate 201 may comprise monocrystalline silicon, such as an N-type silicon wafer, for example. Only one type of diffusion region 202 is shown for clarity of illustration. As can be appreciated, a solar cell typically includes a plurality of P-type diffusion regions and a plurality of N-type diffusion regions. In one embodiment and as shown in FIG. 4, the diffusion region 202 is formed within the substrate 201. In another embodiment (not shown), the diffusion region 202 is external to the substrate 201. For example, the diffusion region 202 may comprise doped polysilicon formed on the backside surface of the substrate 201. In that example, a thin dielectric layer (e.g., thermal oxide) may be formed between the polysilicon and the substrate 201.

The solar cell 200 has a front side 121 that faces toward the sun during normal operation to collect solar radiation, and a backside 122 that is opposite the front side 121. In one embodiment, the solar cell 200 is an all back contact solar cell in that all of its diffusion regions and metal contacts connected to the diffusion regions are on the backside 122. Note, however, that the disclosed techniques may apply equally to other types of solar cells. For example, in other embodiments, the solar cell 200 has a diffusion region 202 of one polarity on the backside 122 and another diffusion region of another polarity on the front side 121.

Still referring to FIG. 4, a dielectric layer 203 is formed on the diffusion region 202. The dielectric layer 203 may comprise one or more layers of dielectric materials. For example, the dielectric layer 203 may comprise silicon nitride or silicon oxide formed to a thickness of about 40 nm. A plurality of contact holes 204 are formed through the dielectric layer 203 to expose the diffusion region 202 and other diffusion regions of the solar cell 200. The contact holes 204 may be formed by laser ablation, lithography, and other contact hole formation processes without detracting from the merits of the present disclosure.

Figure 5:
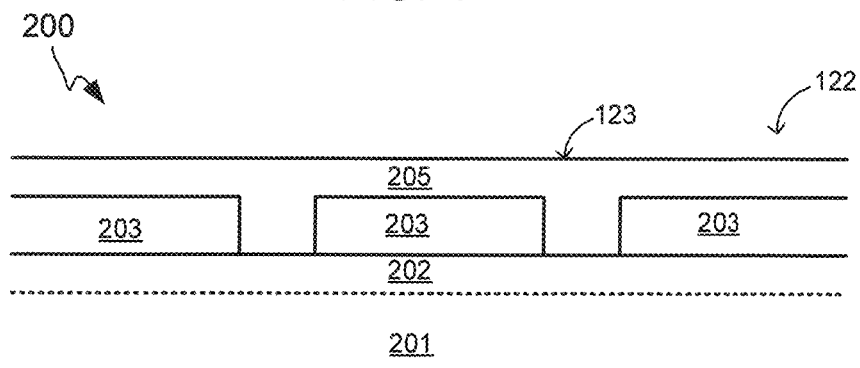

In FIG. 5, an aluminum layer 205 is formed on the backside 122 to make an electrical connection to the diffusion region 202. In one embodiment, the aluminum layer 205 is printed on the dielectric layer 203 and into the contact holes 204. For example, the aluminum layer 205 may be formed to a thickness of 1-50 μm, such as about 10 μm, by screen printing. An aluminum oxide layer 123 may then form directly on the backside surface of the aluminum layer 205. The aluminum layer 205 may be formed directly on the diffusion region 202.

Figure 6:
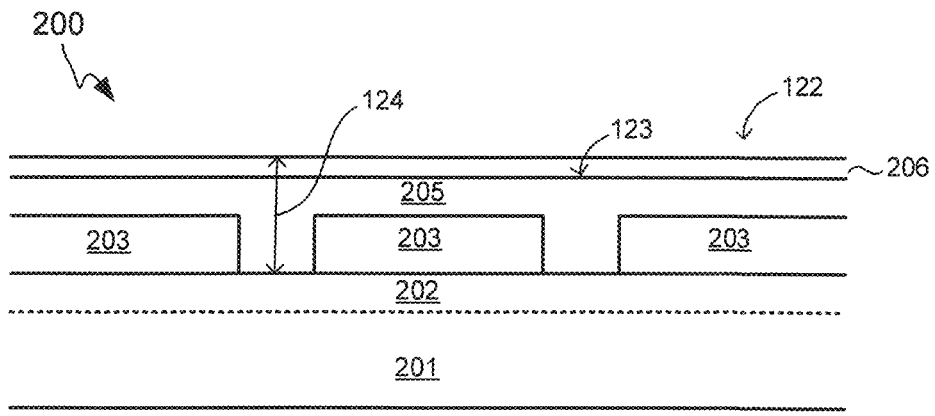

In FIG. 6, a nickel layer 206 is formed on the aluminum layer 205 such that a surface of the nickel layer 206 is directly on the aluminum oxide layer 123. The nickel layer 206 may be formed by electroless plating, electrolytic plating, or other deposition process. The nickel layer 206 may be formed on the aluminum layer 205 to a thickness of 0.1-10 μm, such as about 2 μm, for example. The nickel layer 206 and the aluminum layer 205 form an electroplating seed 124 for electroplating copper, such as in the formation of metal contacts that connect to the diffusion region 202. The nickel layer 206 serves as an adhesion layer to facilitate adhesion of the electroplated copper to the electroplating seed 124.

Figure 7:
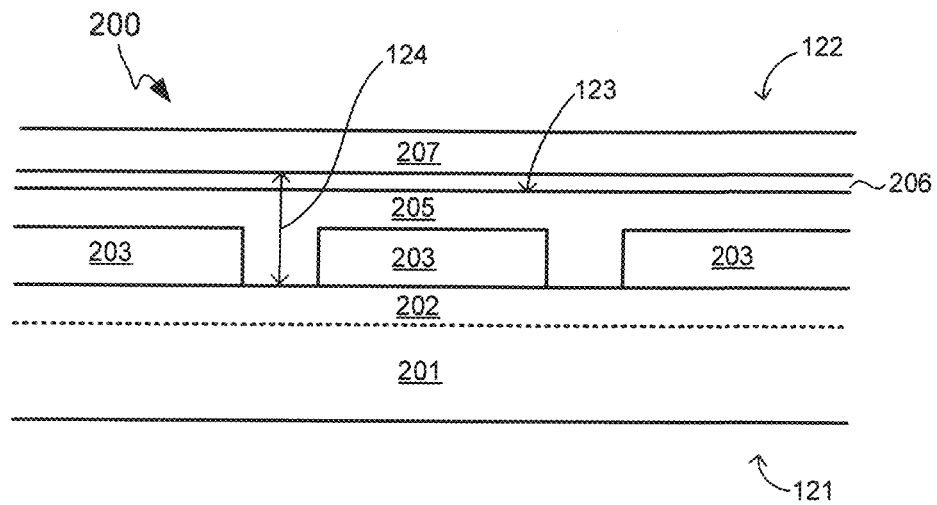

In FIG. 7, a copper layer 207 is formed on the backside 122 of the solar cell 200 to electrically connect to the diffusion region 202. In one embodiment, the copper layer 207 is formed by electroplating in a copper plating bath that comprises methanesulfonic acid but with no sulfuric acid. More particularly, the methanesulfonic acid replaces the sulfuric acid as the copper plating bath's supporting electrolyte. For example, the sulfuric acid in a copper plating bath may be replaced with an equivalent amount of methanesulfonic acid to maintain the same amount of bath acidity. The reaction of methanesulfonic acid with aluminum is given by:

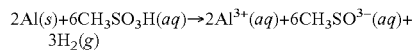

with a $\Delta G(rxn) = -1039.4$ kJ/mol

The reaction of methanesulfonic acid with aluminum oxide is given by:

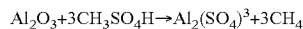

with a $\Delta G(rxn) = 459.3$ kJ/mol

Although the reaction of methanesulfonic acid with aluminum still gives a negative $\Delta G(rxn)$, the reaction of methanesulfonic acid with aluminum oxide gives a positive $\Delta G(rxn)$. The positive $\Delta G(rxn)$ indicates that the methanesulfonic acid will not significantly corrode the aluminum oxide. Thus, the aluminum oxide layer 123 protects the aluminum layer 205 from being attacked by the methanesulfonic acid.

It is to be noted that although the nickel layer 206 is on the aluminum layer 205, the nickel layer 206 is porous and accordingly allows methanesulfonic acid (or sulfuric acid in other plating baths) to seep through and corrode the aluminum layer 205. The methanesulfonic copper plating bath may therefore be advantageous when the electroplating seed includes nickel as an adhesion layer.

In one embodiment, the methanesulfonic acid copper plating bath employed in the electroplating of the copper layer 207 comprises methanesulfonic acid (MSA), Cu-MSA, and, hydrochloric acid, as well as standard commercial plating organic additives, such as accelerators, suppressors, levelers, brighteners, and grain refiners. The pH of the methanesulfonic acid copper plating bath may be approximately −0.6, but generally may have a pH less than 1. Such a methanesulfonic acid copper plating bath may be commercially obtained from the OM Group, Inc., for example. Other suitable copper plating baths with methanesulfonic acid and with no sulfuric acid may also be employed without detracting from the merits of the present disclosure.

In one embodiment, the copper layer 207 is electroplated using the electroplating seed 124 to a thickness of 10-80 μm, such as about 35 μm. For example, the copper layer 207 may be formed by dipping the sample of FIG. 6 in the methanesulfonic acid copper plating bath in an electroplating process with a current of about 40 ASF (amps per square foot) at 25° C., but may also be with a current as high as 200 ASF at 80° C., for example.

In one embodiment, the copper layer 207 electrically connects to the diffusion region 202, and serves as a metal contact of the solar cell 200. As can be appreciated, the copper layer 207 may be patterned or electroplated with an appropriate mask to have a variety of shapes depending on the particulars of the solar cell 200. For example, when the diffusion region 202 is a P-type diffusion region, the copper layer 207 may be configured as a positive metal contact finger that is interdigitated with another copper metal contact finger that electrically connects to an N-type diffusion region.

Figure 8:
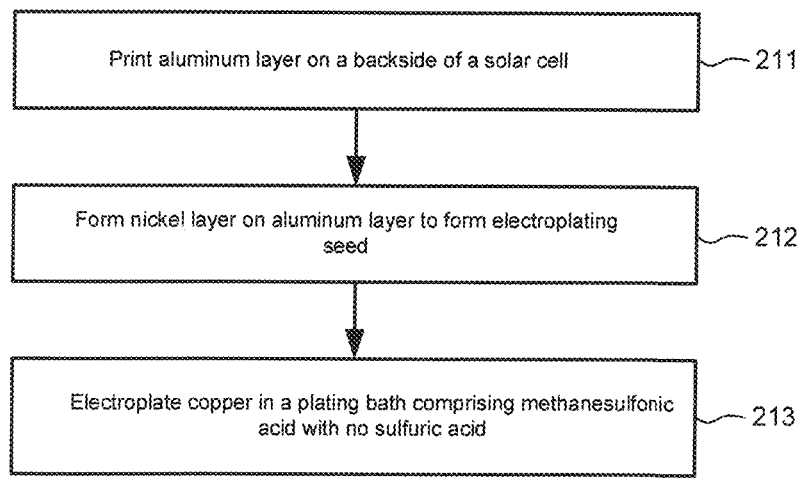
FIG. 8 shows a flow diagram of a method of forming a metal structure of a solar cell in accordance with an embodiment of the present disclosure.

FIG. 8 shows a flow diagram of a method of forming a metal structure of a solar cell in accordance with an embodiment. In the example of FIG. 8, an aluminum layer is formed on a backside of a solar cell being manufactured (step 211). The aluminum layer may be formed by screen printing, for example. In one embodiment, the aluminum layer is screen printed on a dielectric layer and in contact holes that are formed through the dielectric layer to electrically connect to a diffusion region. The aluminum layer includes an aluminum oxide layer on the backside facing surface of the aluminum layer.

A nickel layer is thereafter formed on the aluminum layer (step 212). In one embodiment, the nickel layer and the aluminum layer form an electroplating seed for subsequent electroplating of a copper layer.

A metal contact of the solar cell is formed by electroplating copper in a copper plating bath that comprises methanesulfonic acid and has no sulfuric acid (step 213). As can be appreciated by one of ordinary skill in the art, "no sulfuric acid" or "without sulfuric acid" means that the copper plating bath either has zero amount of sulfuric acid or no appreciable amount of sulfuric acid to react with and corrode aluminum oxide. The copper is electroplated on the electroplating seed to electrically connect to the diffusion region of the solar cell.

The techniques described herein may facilitate improved adhesion of layers of a solar cell. Such improved adhesion can be shown by reduced corrosion of the electroplating seed, as shown in FIGS. 9-11.

Figure 9:
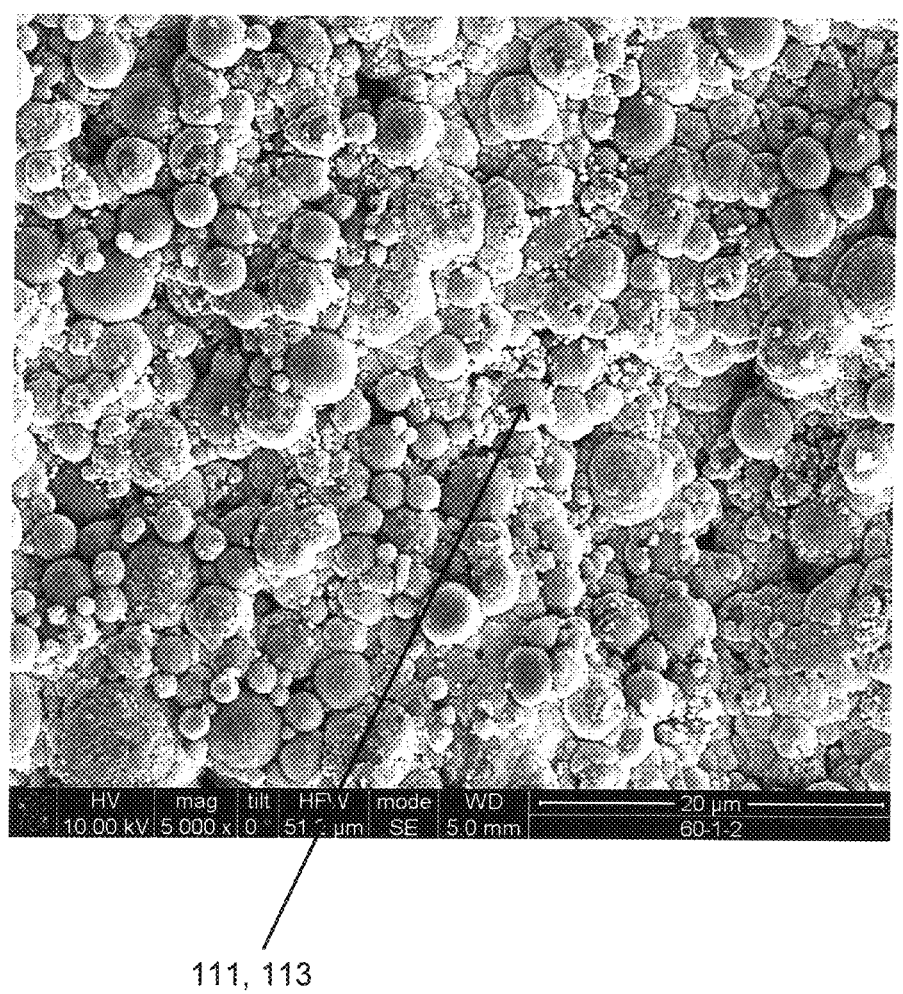
FIGS. 9-11 show micrographs of an aluminum electroplating seed where the aluminum electroplating seed is exposed to methanesulfonic acid instead of sulfuric acid.
Figure 10:
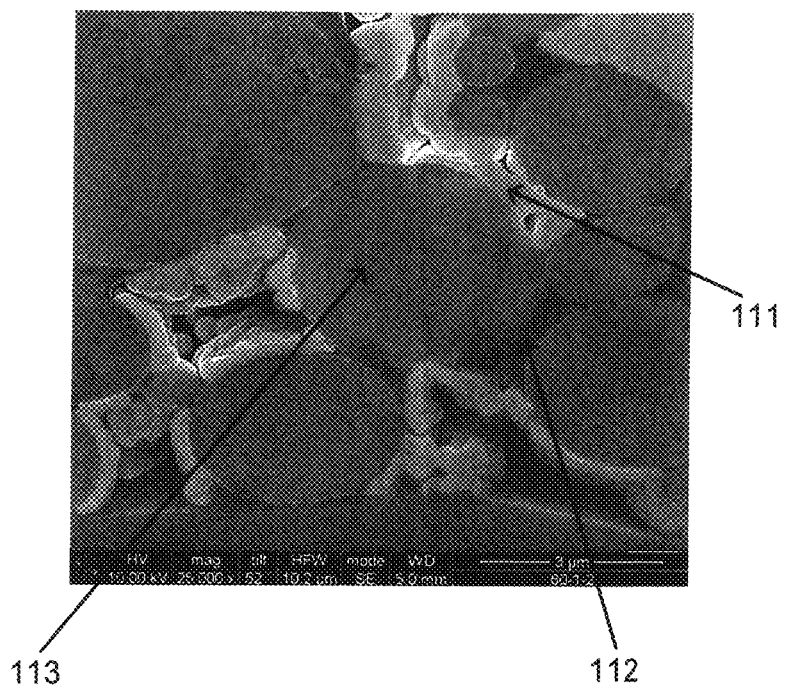
Figure 11:
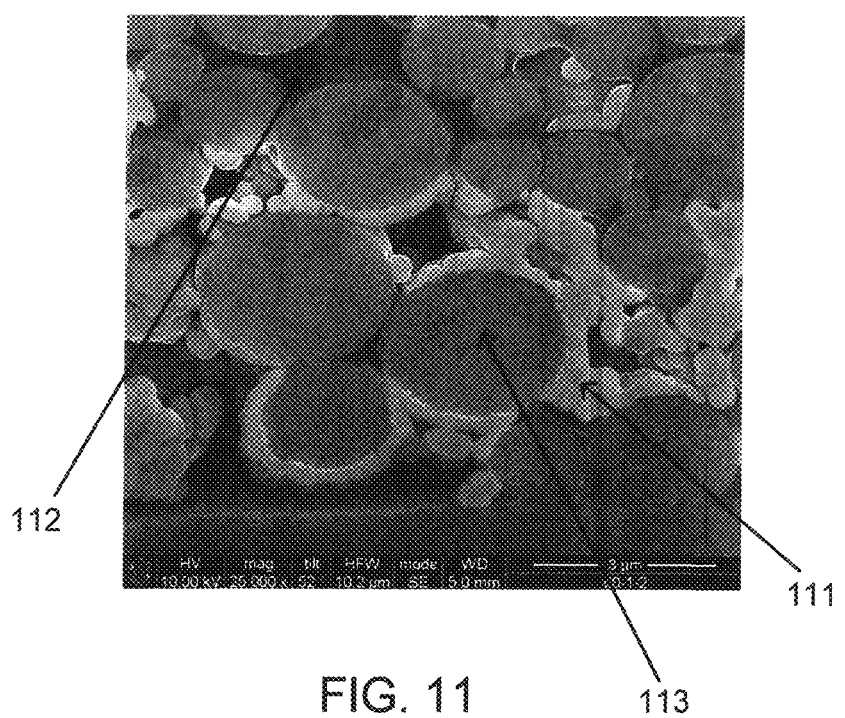

FIGS. 9-11 show micrographs of an aluminum electroplating seed similar to those of FIGS. 1-3, except that the sulfuric acid for FIGS. 9-11 has been replaced with an equivalent amount of methanesulfonic acid. FIG. 9 is a plan view of the nickel coated aluminum and FIGS. 10 and 11 are cross-sections of the aluminum. As can be seen from FIGS. 9-11, the aluminum (see arrow 113), nickel (see arrow 111), and binder (see arrow 112) forming the electroplating seed have not been corroded by the methane sulfonic acid.

Methods and structures for forming metal structures of solar cells have been disclosed. While specific embodiments of the disclosure have been provided, it is to be understood that these embodiments are for illustration purposes and not limiting. Many additional embodiments will be apparent to persons of ordinary skill in the art reading this disclosure.

What is claimed is:

1. A method of fabricating a solar cell, the method comprising:
   forming an aluminum layer on a dielectric layer to connect to a diffusion region of the solar cell through a contact hole in the dielectric layer;
   forming an electroplating seed, wherein said forming the electroplating seed includes forming a nickel layer on the aluminum layer; and
   forming a metal contact that connects to the diffusion region of the solar cell, wherein said forming the metal contact includes electroplating a copper layer on a backside of the solar cell, wherein the copper layer is electroplated in a copper plating bath comprising methanesulfonic acid with no sulfuric acid.

2. The method of claim 1, wherein the nickel layer is plated on the aluminum layer.

3. The method of claim 1, wherein said forming the aluminum layer includes forming the aluminum layer on the dielectric layer comprising silicon oxide.

4. The method of claim 1, wherein said forming the aluminum layer includes printing the aluminum layer on the dielectric layer.

5. The method of claim 4, wherein said printing the aluminum layer includes screen printing the aluminum layer on the dielectric layer.

6. The method of claim 1, wherein said forming the aluminum layer on the dielectric layer includes forming the aluminum layer on the dielectric layer to connect to a diffusion region that is formed within a substrate of the solar cell.

7. The method of claim 1, wherein said forming the aluminum layer on the dielectric layer includes forming the aluminum layer on the dielectric layer that is formed on a solar cell substrate comprising monocrystalline silicon.

8. A method of fabricating a solar cell, the method comprising:
   forming a dielectric layer on a solar cell substrate;
   forming a contact hole through the dielectric layer to expose a diffusion region of the solar cell;
   forming an aluminum layer on the dielectric layer and into the contact hole to connect to the diffusion region; and
   electroplating a copper layer using the aluminum layer as an electroplating seed in a copper electroplating bath comprising methanesulfonic acid.

9. The method of claim 8 wherein said electroplating the copper layer includes electroplating the copper layer in the electroplating bath that has no sulfuric acid.

10. The method of claim 8 further comprising:
    forming a nickel layer on the aluminum layer, wherein the copper layer is electroplated on the nickel layer.

11. The method of claim 10 wherein said forming the nickel layer includes plating the nickel layer on the aluminum layer.

12. The method of claim 8 wherein said forming the aluminum layer includes printing the aluminum layer on the dielectric layer.

13. The method of claim 8 wherein said forming the aluminum layer includes screen printing the aluminum layer on the dielectric layer.

14. The method of claim 8 wherein said forming the aluminum layer includes forming the aluminum layer to connect to the diffusion region that is formed within the solar cell substrate.

15. The method of claim 8 wherein said forming the dielectric layer includes forming the dielectric layer on the solar cell substrate that comprises monocrystalline silicon.

16. A method of fabricating a solar cell, the method comprising:
    forming an aluminum layer on a dielectric layer of the solar cell; and
    electroplating a copper layer using the aluminum layer as an electroplating seed in a copper plating bath having a supporting electrolyte comprising methanesulfonic acid.

17. The method of claim 16 wherein said electroplating the copper layer includes electroplating the copper layer in the copper plating bath that has no sulfuric acid.

18. The method of claim 16 wherein said forming the aluminum layer includes printing the aluminum layer on the dielectric layer.

19. The method of claim 16 further comprising:
    forming a nickel layer on the aluminum layer to form the electroplating seed.

20. The method of claim 16 wherein said electroplating the copper layer includes electroplating the copper layer to connect to a diffusion region of the solar cell.

* * * * *